United States Patent
Murasato (10) Patent No.: US 7,345,834 B2
(45) Date of Patent: Mar. 18, 2008

(54) OPTICAL ELEMENT HOLDING SYSTEM, BARREL, EXPOSURE APPARATUS, AND DEVICE MANUFACTURING METHOD

(75) Inventor: Naoki Murasato, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/431,002

(22) Filed: May 10, 2006

(65) Prior Publication Data
US 2006/0198036 A1    Sep. 7, 2006

Related U.S. Application Data

(62) Division of application No. 11/247,166, filed on Oct. 12, 2005, now Pat. No. 7,116,500.

(30) Foreign Application Priority Data

Oct. 18, 2004    (JP) .............................. 2004-302388

(51) Int. Cl.
    *G02B 7/02*    (2006.01)
(52) U.S. Cl. ...................... 359/819; 359/811; 359/813; 359/822; 359/823; 359/830
(58) Field of Classification Search ................ 359/819, 359/822, 823, 827, 830, 811, 813
    See application file for complete search history.

(56) References Cited

U.S. PATENT DOCUMENTS 4,153,341 A * 5/1979 Kawamura et al. ......... 359/824
5,745,800 A * 4/1998 Kanbara et al. .............. 396/55
6,262,853 B1 * 7/2001 Takanashi et al. .......... 359/703
6,867,848 B2   3/2005 Ebinuma et al. .............. 355/75
6,870,598 B2 * 3/2005 Nishi .......................... 355/30

FOREIGN PATENT DOCUMENTS

JP      2001-343576     *    3/2001
JP      2001-343576         12/2001

* cited by examiner

*Primary Examiner*—David Spector
*Assistant Examiner*—Brandi N. Thomas
(74) *Attorney, Agent, or Firm*—Fitzpatrick, Cella, Harper & Scinto (57) ABSTRACT

A holding system for holding an optical element. The holding system includes a ring-like inner holding member disposed at an outer periphery of the optical element, for supporting the optical element by use of at least a pair of pieces, and a ring-like outer holding member disposed at an outer periphery of the inner holding member and connected to the inner holding member at plural points. The inner holding member has at least a pair of driving units with an actuator, for supporting the optical element through the actuators.

6 Claims, 10 Drawing Sheets

OPTICAL ELEMENT HOLDING SYSTEM, BARREL, EXPOSURE APPARATUS, AND DEVICE MANUFACTURING METHOD

This application is a divisional application of U.S. patent application Ser. No. 11/247,166, filed Oct. 12, 2005, now U.S. Pat. No. 7,116,500.

FIELD OF THE INVENTION AND RELATED ART

This invention relates to an optical element holding system for holding an optical element, such as a lens or a mirror, for example. In another aspect, the invention concerns a barrel or an exposure apparatus having such an optical element holding system, and a device manufacturing method using such an exposure apparatus.

In recent years, reduction projection type semiconductor exposure apparatuses have used a short wavelength light source based on an excimer laser, so as to meet further miniaturization in size of a chip pattern and enlargement in density of a semiconductor chip. The semiconductor exposure apparatus is an apparatus for transferring an original (reticle) having a circuit pattern to a substrate (silicon wafer), and it uses a reduction projection lens by which the circuit pattern can be transferred by exposure onto the substrate.

The projection lens must have an extraordinarily high resolving power to make it possible to produce a very fine and highly integrated circuit. To assure this, aberration of the projection lens must be corrected to an extremely low level.

Conventionally, in such a projection lens system, optical elements, such as lenses or mirrors, are held inside a lens barrel in accordance with the following methods.

(1) A press fixing method in which an optical element is supported along its entire circumference by use of a frame, such as a metal frame, and, by pressing the frame from above by using a thread screw ring, the optical element is press-fixed.

(2) A three-point support method in which an optical element is supported at three points equidistantly distributed along its circumferential direction.

Japanese Laid-Open Patent Application, Publication No. 2002-343576, shows another method in which an elastic member is provided between a metal frame, which directly supports an optical element, such as a lens, and a supporting member disposed outside the metal frame. According to this method, any distortion of the optical element due to a temperature change or caused by assembling can be suppressed by the elastic member.

In these methods, however, the surface shape of the lens, which is supported along its entire circumference or at three points on the circumference would be left deformed due to the weight of the lens itself. There is no function for adjusting the surface shape of the lens.

SUMMARY OF THE INVENTION

It is accordingly an object of the present invention to provide a unique and an improved optical element holding technique by which the shape of an optical element can be adjusted.

In accordance with an aspect of the present invention, there is provided a holding system for holding an optical element, comprising a ring-like inner holding member disposed at an outer periphery of the optical element, for supporting the optical element by use of at least a pair of pieces, a ring-like outer holding member disposed at an outer periphery of the inner holding member and connected to the inner holding member at plural points, wherein the inner holding member has at least a pair of driving units with an actuator, for supporting the optical element through the actuators.

In accordance with another aspect of the present invention, there is provided a barrel for accommodating an optical element therein, comprising a holding system as discussed above, for holding the optical element.

In accordance with a further aspect of the present invention, there is provided an apparatus for exposing a substrate to light, comprising a projection optical system through which the substrate is to be exposed to the light, and a holding system, as discussed above, for holding an optical element having a function for directing the light.

In accordance with a yet further aspect of the present invention, there is provided a device manufacturing method, comprising the steps of exposing a substrate to light by use of an apparatus as discussed above, developing the exposed substrate, and processing the developed substrate to produce a device.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

In a first embodiment of the present invention, an optical element holding system of the present invention is applied to a projection optical system for use in an exposure apparatus. However, it may be applied also to an illumination optical system of an exposure apparatus or to any other optical systems.

Figure 1:
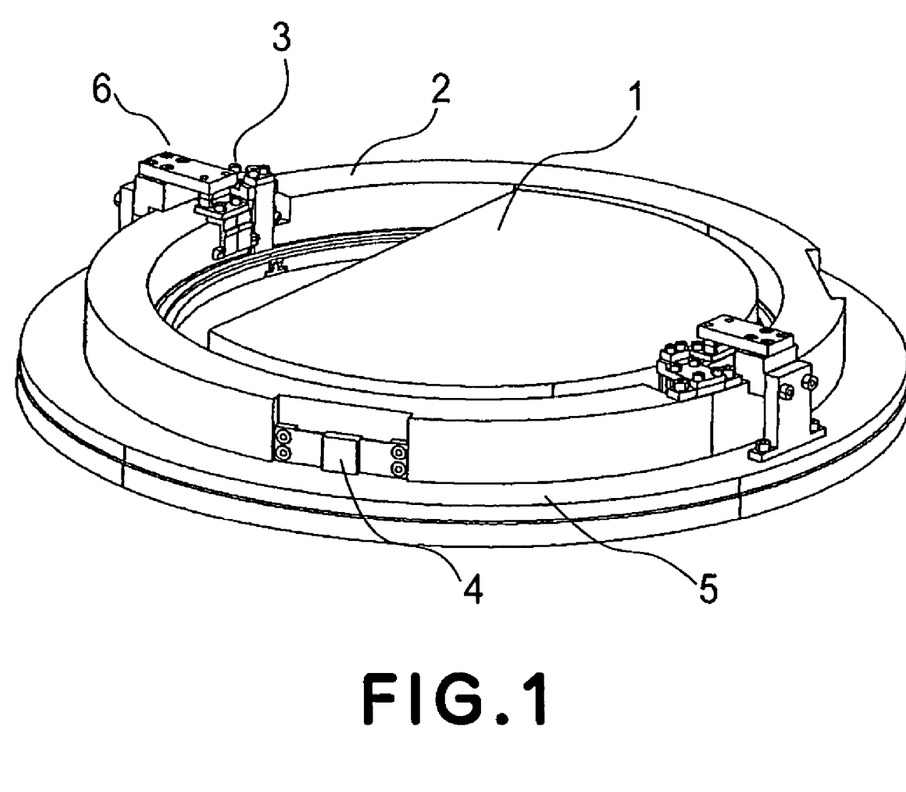
FIG. 1 is a perspective view of a general structure of an optical element holding system according to a first embodiment of the present invention.

FIG. 1 is a perspective view of a general structure of an optical element holding system according to the first embodiment of the present invention.

The optical element denoted at 1 may have an optical function such as reflection, refraction, diffraction, etc. Typically, it may be a mirror, a lens or a diffraction grating. An inner holding member denoted at 2 is held inside an outer holding member 5, and it is arranged to fixedly hold the optical element 1 by use of a pair of, or more, pieces 2a. The inner holding member 2 is provided with a pair of, or more, driving units 3 arranged to apply at least one of load and displacement to the optical element 1, such as a lens, for example, to thereby control the attitude and/or surface shape of the optical element 1. Any changes in attitude of the optical element 1 due to deformation of the inner holding member 2 may be cancelled by adjusting at least one of the amount of load and the amount of displacement to be applied by the driving units 3.

Figure 2:
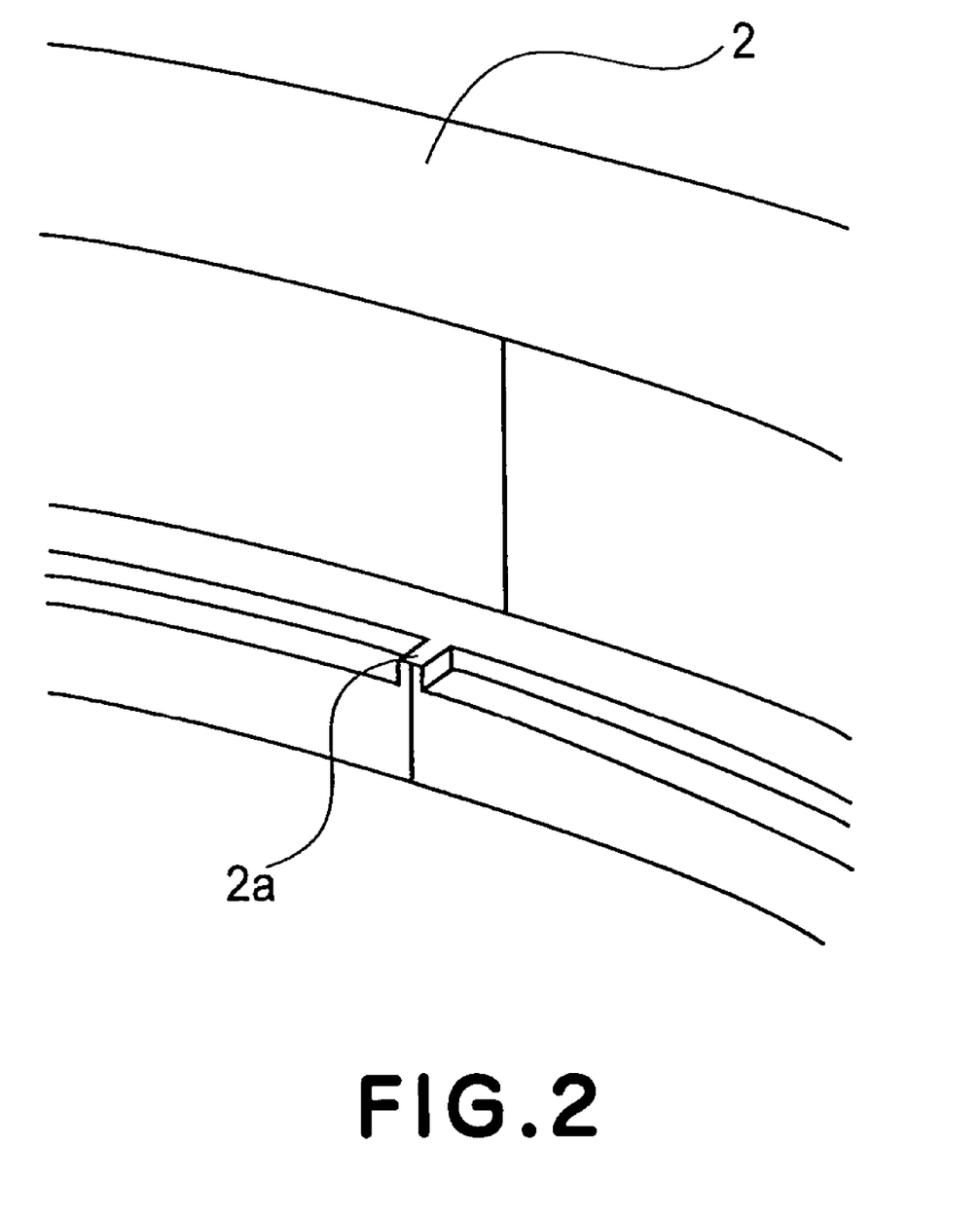
FIG. 2 is a fragmentary enlarged view, illustrating the structure of an inner holding member 2 of the first embodiment shown in FIG. 1.

The optical element 1 and the inner holding member 2 are in direct contact with each other at pieces 2a shown in FIG. 2. The pieces 2a are disposed at two points on the inner holding member 2, which are disposed opposed to each other at a 180-degree pitch. There are elastic members 4 with springs, which are disposed at plural points between the outer holding member 5 and the inner holding member 2. The elastic members 4 are arranged to absorb deformation in the radial direction, but have high rigidity with respect to the optical axis direction and the tangential direction.

Depending on the disposition of driving units 3, which are provided mainly to adjust the shape of the optical element 1, the disposition of the pieces 2a, as well as the number of them, may be varied.

In the first embodiment, it is intended to deform the optical element 1 into a symmetrical shape with a 90-degree pitch, and, therefore, the driving units 3 are provided at two points with a 180-degree pitch.

Now, the method of holding the optical element 1 will be explained in greater detail. The optical element 1 is in contact with the pieces 2a, at its outer periphery of the optically effective region thereof. Here, birefringence in which the refractive index changes in dependence upon the direction of polarization of light incident on the optical element 1 may occur in proportion to the load applied to the optical element 1, and such birefringence may be distributed radially from the point where the load is applied. In consideration of this, the distance to the effective region of the optical element 1 from the position where the optical element 1 contacts with the pieces 2a should preferably be made as large as can be allowed by the weight of the optical element 1 or by the tolerance in the lens production process. Furthermore, if a load is applied perpendicularly to the optical axis, the amount of birefringence production will be enlarged thereby. Taking this into account, the position where the piece 2a contacts the optical element 1 is at the bottom of face of the optical element 1. If the holding force is insufficient and additional pieces should be provided to supplement it, preferably, they should have a structure for pressing the optical element 1 from either the bottom face or top face thereof, not at the side face of the optical element 1.

Furthermore, each piece 2a should preferably be made to leave a sufficiently small area to avoid the possibility of scratching the optical element 1 surface, for example. This is because of the necessity that the amount of deformation by the weight of the lens should be made substantially equal to the result of deformation calculation of CAE.

In order to obtain a desired holding force, the optical element 1 and the inner holding member 2 may be adjoined to each other by filling, with an adhesive agent, the clearance therebetween along their entire circumferences. This would assure stable holding. A suitable adhesive agent should be chosen on that occasion, while carefully taking into account the degassing characteristic, the setting contraction characteristic, and the elasticity error thereof. In this embodiment, a fluorine series two-liquid adhesive agent was used.

The driving units 3 are provided at two mutually opposed points on the inner holding member, and they are arranged to apply a desired displacement and/or a desired load to the optical element 1.

Figure 3:
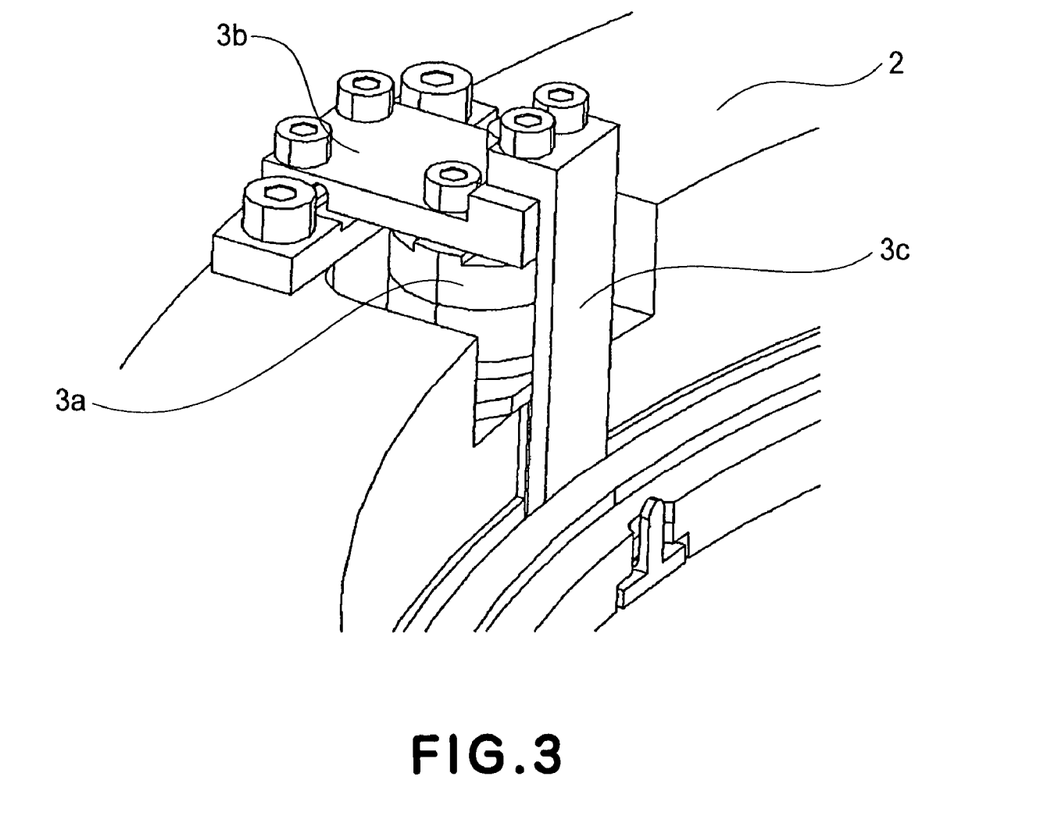
FIG. 3 is a fragmentary enlarged view, illustrating details of a driving unit 3 of the first embodiment shown in FIG. 1.

FIG. 3 shows details of one driving unit 3. The optical element 1 is not shown there, for better understanding.

A welded bellows 3a is provided on the inner holding member 2 as an actuator. By pressurizing the inside space of the bellows 3a by using air, the bellows 3a can produce a force which is proportional to the pressure. This force can be transmitted to the optical element 1 via lever members 3b and 3c, whereby a desired surface shape and a desired attitude are attainable. The lever member 3b has a notch formed at the inner holding member 2 side thereof, to obtain a suitable spring property. If the rigidity of that portion is high, it necessitates the bellows 3a to produce an extra product force. Therefore, the rigidity should preferably be lowered unless the eigenvalue becomes too low.

The lever member 3c should provide a function for transmitting a force to the optical element 1 without being distorted by the product force produced by the bellows 3. For this reason, it should preferably include a high-rigidity material, such as ceramics, for example. The lever member 3c has been positioned by use of a spacer so that, in the initial state thereof, it is placed close to the bottom face of the optical element 1. The free end of the lever member 3c has an R-shape so that it contacts the optical element 1 at a single point or along a line.

Depending on the position where the bellows 3a contacts the lever members 3c, the leverage (lever ratio), that is, the ratio between the product force of the bellows 3a and the load applied to the optical element 1, varies. Thus, the relationship between the pressure of the bellows 3a and the amount of displacement of the optical element 1 may be measured beforehand, and the position of the bellows 3a may be adjusted finely so as to provide an appropriate leverage.

Next, the inner holding member 2 and the outer holding member 5, which is at the outside of the projection system, will be described in greater detail.

The outer holding member 5 serves to directly connect each unit that holds an associated one of the optical elements of the projection system, and thus, the flatness at its upper and lower connecting surfaces as well as the circularity of its outer configuration should have a highest precision. Therefore, use of a high rigidity is preferable with respect to the machining. The outer holding member 5 and the inner holding member 2 are connected with each other by use of elastic members 4, at three points with a 120-degree pitch. Each elastic member 4 is made to provide an appropriate resiliency in the radial direction due to its leaf spring means, but to provide a high rigidity in the optical axis direction and the tangential direction. With this arrangement, any stress due to a difference in linear expansion coefficient between the inner holding member 2 and the outer holding member 5, as well as any stress resulting from the assembling, can be prevented from being transmitted to the optical element 1 through the inner holding member 2.

Regarding the rigidity of the elastic members 4, in order to well assure evasion, it should be made lower than the rigidity of the inner holding member 2. Furthermore, in order to avoid vibration attributable to any external disturbance, the elastic members 4 should have a sufficiently high natural frequency. Each elastic member 4 is connected to the inner holding member 2 at three points with a 120-degree pitch.

Next, disposition of the elastic members 4 will be explained in detail.

When a load is applied to the optical element 1 from the driving unit 3, a reaction force as well is applied simultaneously to the inner holding member 2. This causes deformation of the inner holding member 2. Taking the outer holding member 5 as a reference, such deformation might cause a tilt of the inner holding member 2 and the optical element 1.

Figure 4A:
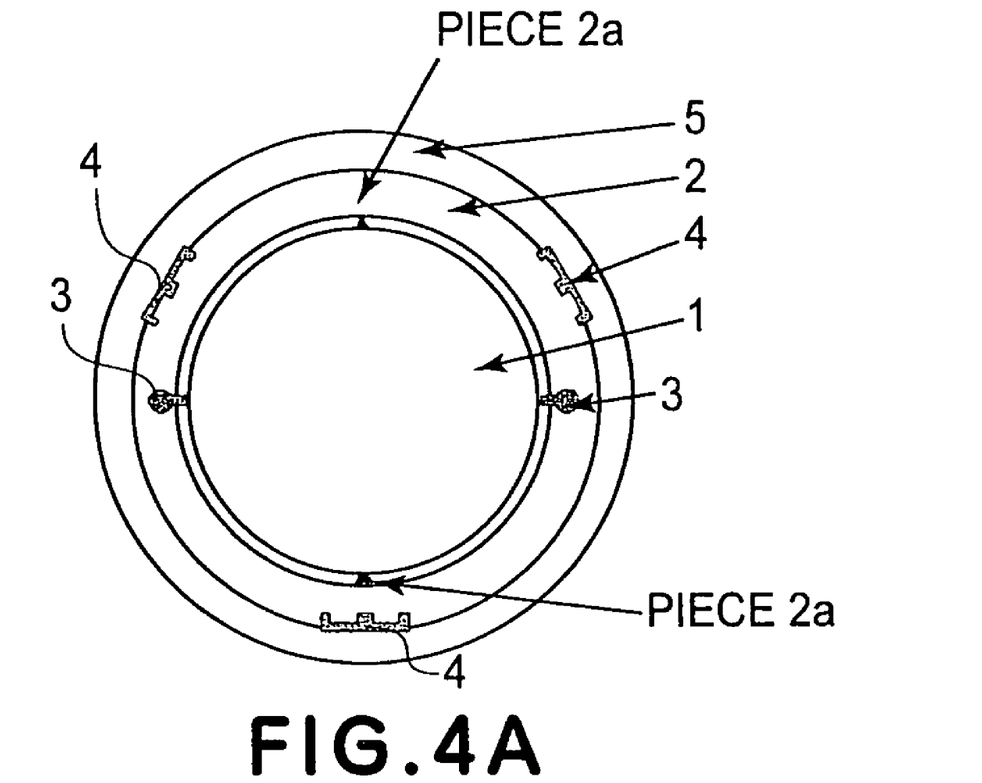
FIGS. 4A and 4B are sectional views, respectively, for explaining the disposition of the inner holding member 2 and elastic members 4 in the first embodiment shown in FIG. 1.
Figure 4B:
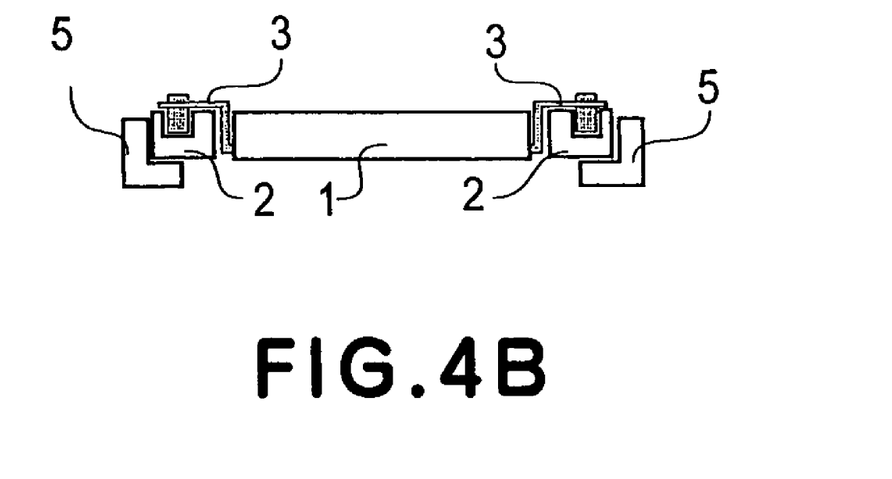
Figure 5A:
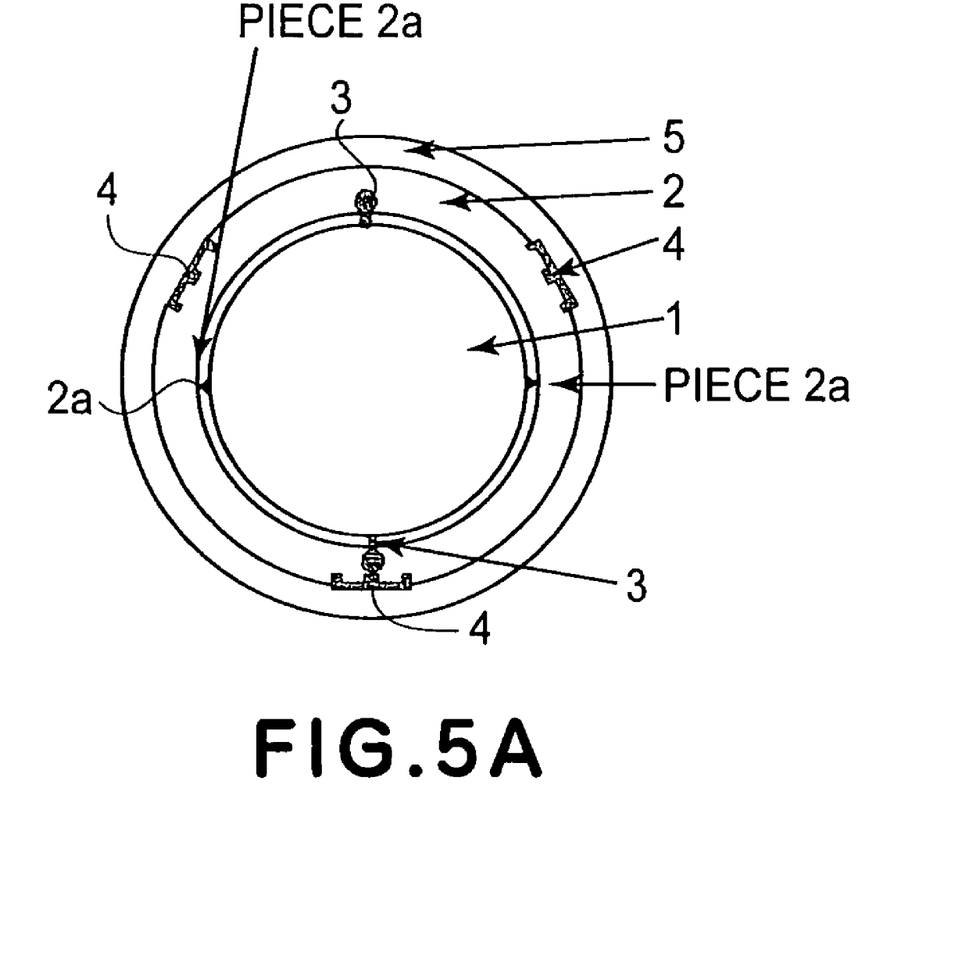
FIGS. 5A and 5B are sectional views, respectively, for explaining the disposition of the inner holding member 2 and elastic members 4 in an alternative example of the first embodiment shown in FIG. 1.
Figure 5B:
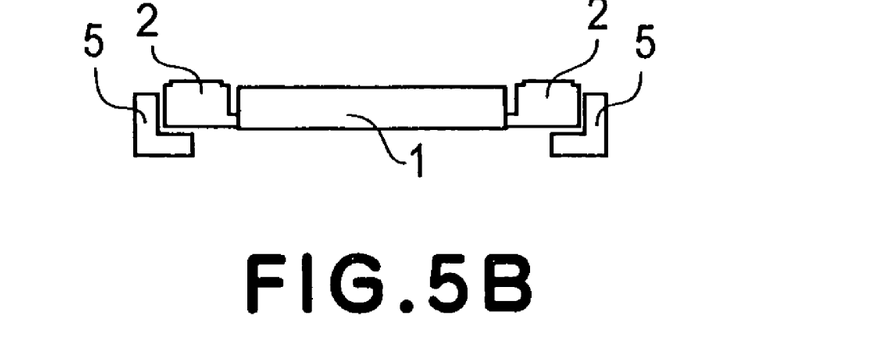

In consideration of this and in order to minimize the tilt, it would be preferable that a pair of (or more) pieces 2a and a pair of (or more) driving units 3 are disposed alternately, and that they have an even distance to an associated one of the elastic members 4. More specifically, as shown in FIG. 4A, the elastic members 4 should preferably be disposed symmetrically with respect to a line that connects two opposed pieces 2a. Alternatively, as shown in FIG. 5A, they may preferably be disposed symmetrically with respect to a line that connects two opposed driving units 3.

Next, with respect to the disposition example of FIGS. 4A and 5A, how the deformation of the inner holding member 2 causes a change in attitude of the optical element 1 will be explained in detail.

As regards the phase relationship between the four points that support the lens and the three points of the elastic members that support the metal frame or the inner holding member 2, it should be determined carefully while taking into account the changes in attitude of the optical element due to deformation of the inner holding member.

At any point among the four points of the inner holding member, being in direct contact with the optical element, the inner holding member can deform due to a reaction force of the load applied to the optical element. Particularly, at the fixed pieces which are at two points out of the four points, adjustment is difficult to do and deformation thereof would have an adverse influence upon the attitude of the optical element. In consideration of this, the fixed pieces at the two points should preferably be disposed to have an even distance to the elastic members.

On the other hand, regarding the remaining two points of the driving units, deformation of the inner holding member can be cancelled by adjusting the output of the actuator.

When the bellows 3a is not producing any product force, the optical element 1 is supported substantially at two points. As the product force increases gradually, in the middle portion thereof, the optical element 1 is supported at four points. As the product force increases further, it is supported at two points, but inversely to the initial support state.

Figure 6:
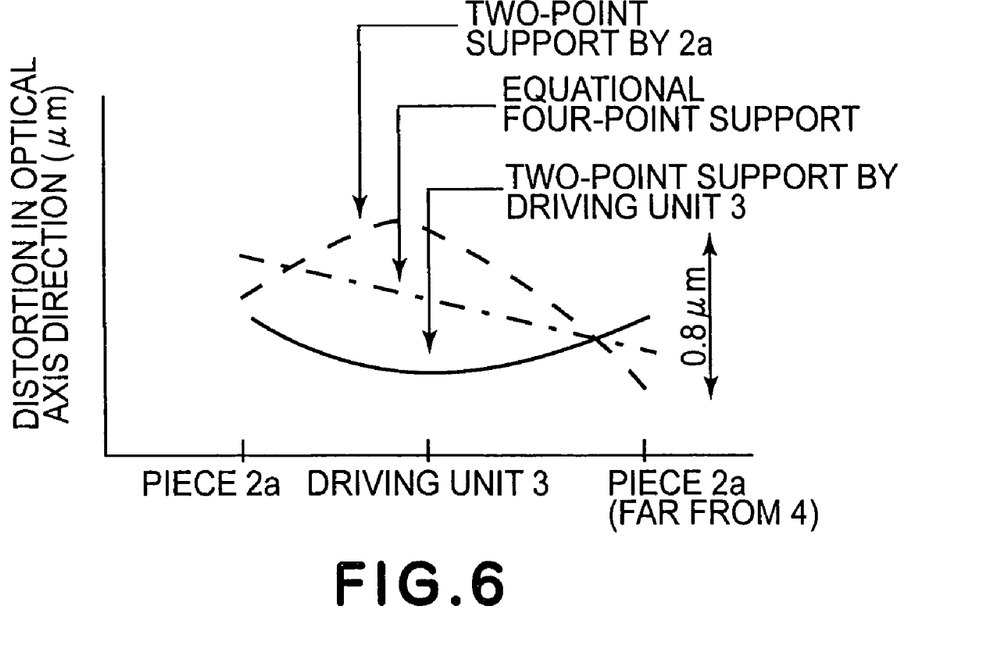
FIG. 6 is a graph for explaining the amount of deformation of the inner holding member 2 in the embodiment shown in FIG. 4.
Figure 7:
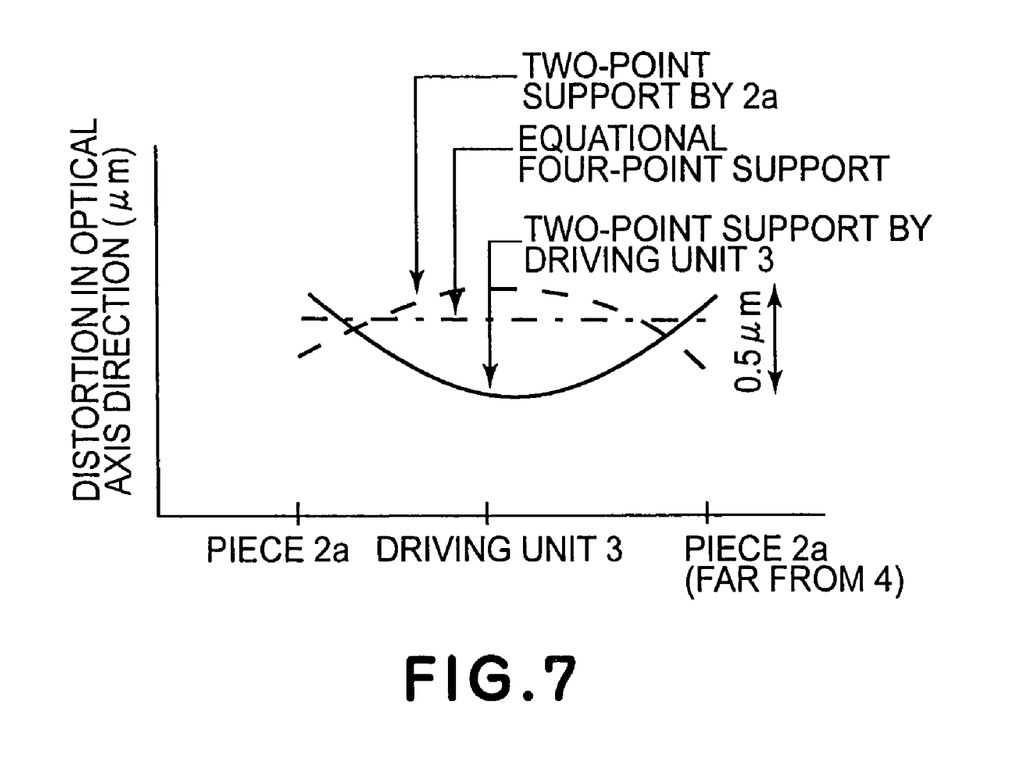
FIG. 7 is a graph for explaining the amount of deformation of the inner holding member 2 in the embodiment shown in FIG. 5.

Regarding the amount of deformation of the inner holding member 2 to be produced in these cases, deformation amounts in the case of the FIG. 4A/4B structure are illustrated in FIG. 6, and deformation amounts in the case of the FIG. 5A/5B structure are shown in FIG. 7.

In the example shown in FIG. 6, in the initial two-point support state, the position of one of the pieces 2a, which is farther from the elastic member, distorts downwardly due to the weight of the optical element 1. As the product force increases further and finally, the optical element 1 is supported at two points by the driving units 3, the pieces 2a become free from the weight of the optical element 1 and thus, they are deformed upwardly. The largest deformation as compared with the initial state occurs at the piece 2a, which is farther from the elastic member 4. This causes a tilt in the inner holding member 2 and the optical element 1, as well.

As compared therewith, in the example shown in FIG. 7, since the two pieces 2a are at equal distances from the elastic members 4, deformations produced there would have an approximately even amount. This hardly causes a tilt.

The largest deformation occurs at one of the driving units 3, which is farther spaced from the elastic member 4. However, this can be adjusted by increasing the product force of the bellows 3a only at one side, thereby to correct the tilt of the optical element. In consequence, when the leaf elastic members 4 are disposed in the manner described with reference to the modified example of the first embodiment, as shown in FIG. 5, while taking into account the deformation amount of the inner holding member 2, aberration of the optical element can be reduced to a minimum.

Next, the method of detecting changes in attitude and surface shape of the optical element 1 will be explained.

The adjustment quantity for at least one of the load and the displacement applied by the driving unit 3 may be feedback-controlled on the basis of the position of a movable portion in the driving unit 3 as can be detected by a sensor. This sensor may directly detect displacement of the optical element 1.

For this detection, an electrostatic capacitance type sensor may be used, for example. Alternatively, in this detection, any type of sensor may be used, such as a laser interferometer, a strain gauge, or a linear scale, for example, provided that it enables detection being proportional to the attitude or surface shape of the optical element 1. As a further alternative, a strain gauge may be provided in the deformable portion of the driving unit 3 and it may be semi-closed controlled.

The first embodiment will be explained here with reference to an example wherein an electrostatic capacitance type sensor is used. Regarding the points to be placed, sensors may be disposed at two points of the driving unit 3. FIG. 1 illustrates sensor units 6. In this example, although each sensor unit 6 is placed at a position a few degrees rotated from the drive unit 3, this being for convenience of disposition, preferably, it should be disposed superposedly upon the driving unit 3 or closest to it. The member for mounting the sensor may be adhered to the outside diameter of the optical element 1 by using an adhesive agent. From the standpoint of deformation and birefringence of the optical element 1, a loading method, such as using screws, is undesirable.

As regards the reference for the detection, the outer holding member 5 may preferably be used as the reference. However, if the reproducibility is assured, the inner holding member 2 may be used as the reference, since it is less affected by external disturbance.

Next, an optical element holding system according to a second embodiment of the present invention will be described.

Figure 8:
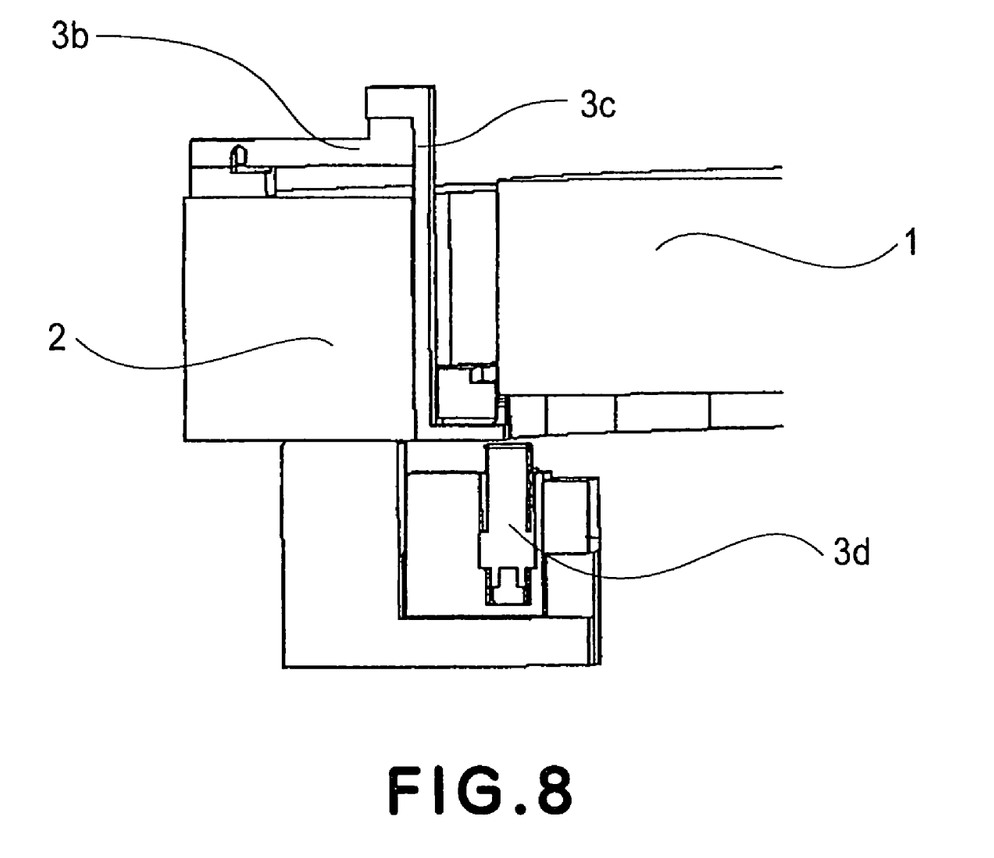
FIG. 8 is a fragmentary schematic view for explaining the structure of a driving unit in an optical element holding system according to a second embodiment of the present invention.

With reference to the driving unit 3 of the first embodiment, in place of the bellows 3a, the actuator may comprise a piezoelectric device (3d) having high rigidity and good response.

FIG. 8 illustrates a driving unit for the optical element holding system according to the second embodiment of the present invention. As regards the position of the piezoelectric device 3d, it may be disposed below the lever member 3b, as in the case of the welded bellows 3a of the first embodiment. Since, however, the piezoelectric device 3d has a short stroke, there is a possibility that the product force thereof is absorbed by the strain of the lever member 3b. In consideration of this, preferably, the piezoelectric device should be disposed below the lever member 3c. This arrangement assures direct transmission of the displacement of the piezoelectric device 3d to the optical element 1, without a loss. The initial positioning of the piezoelectric device 3d may be accomplished by use of a screw or a spacer. The piezoelectric device 3d should be disposed as close as possible to the bottom face of the optical element 1. Alternatively, the piezoelectric device 3d may preferably be disposed so that it can abut against the bottom face of the optical element when a small displacement of a few microns or sub-micron order is applied to the piezoelectric device 3d.

Figure 9:
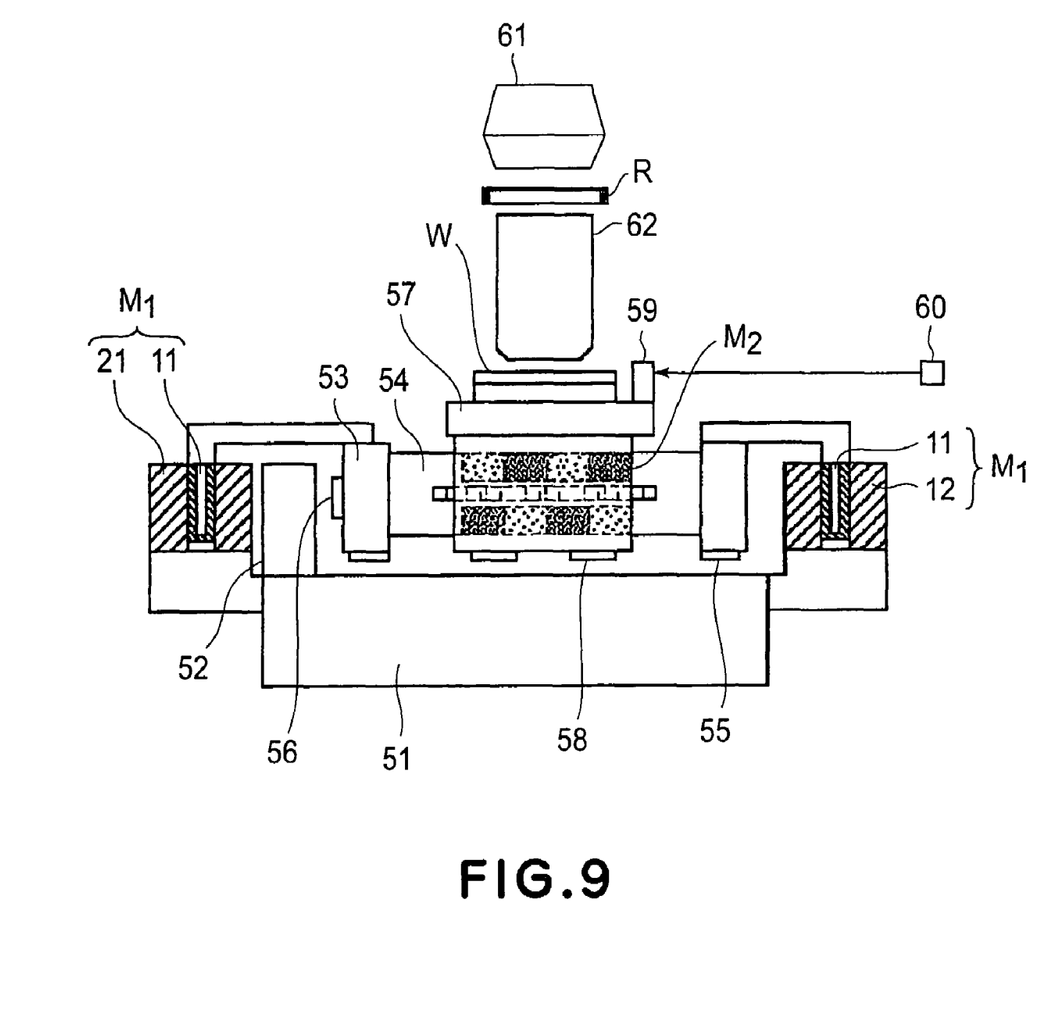
FIG. 9 is a schematic view of a general structure of an exposure apparatus to which the present invention is applied.

FIG. 9 shows an exposure apparatus for semiconductor device manufacture, to which the present invention is applied.

This exposure apparatus can be used for the manufacture of microdevices having a fine pattern formed thereon, such as semiconductor devices (semiconductor integrated circuits, for example), micromachines, or thin-film magnetic heads, for example. In this exposure apparatus, exposure light (which may include visible light, ultraviolet light, EUV light, X-rays, electron beams, and charged particle beams, for example) as exposure energy supplied from a light source 61 illuminates a reticle R (original), and light from the reticle R is projected onto a semiconductor wafer W (substrate) through a projection system having a projection lens 62 (which may include a refractive lens, a reflective lens, a catadioptric lens system, and a charged particle lens, for example), whereby a desired pattern is produced on the substrate.

The exposure apparatus includes a base table 51 having a guide 52 and a linear motor stator 21 fixed thereto. The linear motor stator 21 has a multiple-phase electromagnetic coil, while a linear motor movable element 11 includes a permanent magnet group. The linear motor movable portion 11 is connected as a movable portion 53 to a movable guide 54 (stage), and through the drive of the linear motor M1, the movable guide 54 can be moved in a direction of a normal to the sheet of the drawing. The movable portion 53 is supported by a static bearing 55, taking the upper surface of the base table 51 as a reference, and also by a static bearing 56, taking the side surface of the guide 52 as a reference.

A movable stage 57, which is a stage member disposed to straddle the movable guide 54, is supported by a static bearing 58. This movable stage 57 is driven by a similar linear motor M2, so that the movable stage 57 moves leftwardly and rightwardly as viewed in the drawing, while taking the movable guide 54 as a reference. The motion of the movable stage 57 is measured by means of an interferometer 60 and a mirror 59, which is fixed to the movable stage 59.

A wafer (substrate) W is held on a chuck, which is mounted on the movable stage 57, and a pattern of the reticle R is transferred in a reduced scale onto different regions on the wafer W by means of the light source 61 and the projection optical system 62, in accordance with a step-and-repeat method or a step-and-scan method.

It should be noted that the optical element holding system according to the present invention also can be similarly applied to an exposure apparatus in which, without using a mask, a circuit pattern is directly drawn on a semiconductor wafer to expose a resist thereon.

In one preferred embodiment of the present invention, the invention is applied to a barrel for supporting one or more optical elements, such as the barrel of the projection optical system 62 described above, and the barrel may include at least one optical element holding system described hereinbefore.

In another preferred embodiment of the present invention, the invention is applied to a device manufacturing method, which may include a process for producing a device by use of an exposure apparatus as described above.

In accordance with these embodiments of the present invention as applied to a barrel, an exposure apparatus and a device manufacturing method, such as described above, the surface shape of an optical element can be controlled and aberrations can be corrected thereby. As a result, higher precision pattern transfer is assured.

Next, an embodiment of a device manufacturing method, which uses an exposure apparatus described above, will be explained.

Figure 10:
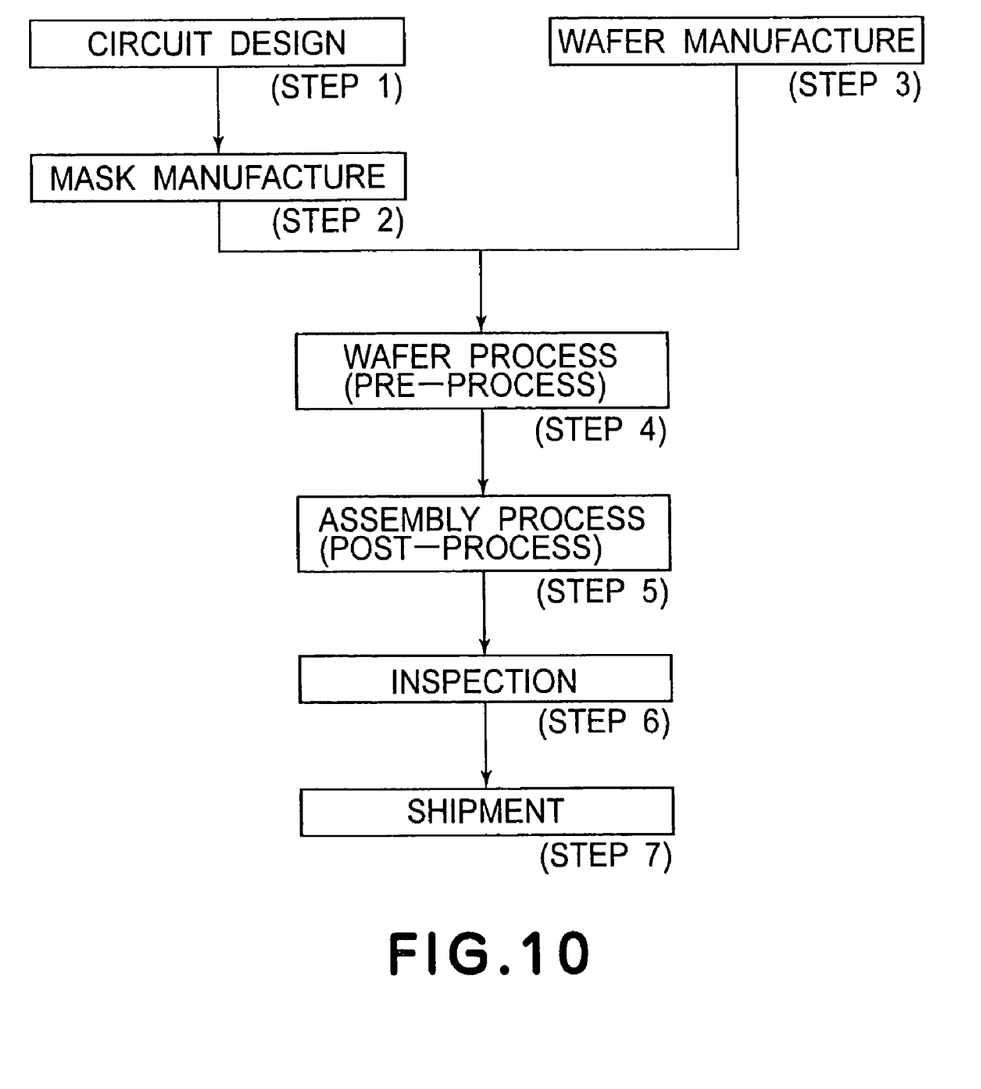
FIG. 10 is a flow chart for explaining the overall procedure of semiconductor device manufacture.

FIG. 10 is a flow chart for explaining the overall procedure for semiconductor manufacture. Step 1 is a design process for designing a circuit of a semiconductor device. Step 2 is a process for making a mask on the basis of the circuit pattern design.

On the other hand, Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check and so on, for the semiconductor devices produced by step 5, are carried out. With these processes, semiconductor devices are produced, and finally, they are shipped (step 7).

More specifically, the wafer process a step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

In accordance with these embodiments of the present invention, as applied to an optical element holding system and a barrel, as described hereinbefore, an optical system by which the shape of an optical element can be adjusted, by which a change in attitude of a lens can be suppressed, or by which a desired optical performance is assured, is provided.

Furthermore, in accordance with these embodiments of the present invention as applied to an exposure apparatus and a device manufacturing method, as described hereinbefore, higher precision pattern transfer or pattern formation is assured.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-302388 filed Oct. 18, 2004, which is hereby incorporated by reference.

What is claimed is:

1. A holding apparatus for holding an optical element, said apparatus comprising:
    a ring-like inner holding member disposed at an outer periphery of the optical element and including a pair of pieces configured to contact and to support the optical element, said pair of pieces being disposed opposite to each other;
    three connection members arranged at 120-degree pitches;
    a ring-like outer holding member disposed at an outer periphery of said inner holding member and configured to hold said inner holding member via said plurality of connection members; and
    a pair of driving units and a pair of contact members, said pair of driving units arranged on said inner holding member and configured to support the optical element, wherein each of said pair of driving units includes an actuator and a contact member of said pair of contact members configured to contact and to support the optical element, and is configured to drive said contact member relative to said inner holding member by said actuator to change a load applied from the optical element to said contact member, said pair of contact members being disposed opposite to each other,
    wherein said pair of pieces and said pair of contact members are arranged at 90-degree pitches, and said three connection members are arranged between said inner holding member and said outer holding member and symmetrically with respect to a line that connects said pair of contact members with each other.

2. An apparatus according to claim 1, wherein said actuator includes a bellows.

3. An apparatus according to claim 1, wherein said actuator includes a piezoelectric device.

4. A barrel for accommodating an optical element therein, said barrel comprising:
    a holding apparatus as defined in claim 1 for holding the optical element.

5. A method of manufacturing a device, said method comprising steps of:
    exposing a substrate to light by use of an exposure apparatus as defined in claim 1;
    developing the exposed substrate; and
    processing the developed substrate to manufacture the device.

6. An apparatus according to claim 1, wherein said pair of pieces is disposed at positions opposed to each other, and said pair of driving units is disposed at positions opposed to each other.

* * * * *